United States Patent [19]

Kling et al.

[11] Patent Number: 4,646,050
[45] Date of Patent: Feb. 24, 1987

[54] GLOW DISCHARGE STARTER

[75] Inventors: Michael R. Kling, Lycoming, Pa.;
Emery G. Audesse, Beverly, Mass.

[73] Assignee: GTE Products Corporation, Danvers, Mass.

[21] Appl. No.: 799,881

[22] Filed: Nov. 20, 1985

[51] Int. Cl.$^4$ .............................................. H01H 61/00
[52] U.S. Cl. ......................................... 337/27; 337/22
[58] Field of Search .................................. 337/22–27, 337/380, 372

[56] References Cited

U.S. PATENT DOCUMENTS

| 2,432,488 | 12/1947 | Peacock et al. | 337/27 |
| 3,597,838 | 8/1971 | Dennis | 337/372 |
| 3,753,191 | 8/1973 | Dennis | 337/380 |

Primary Examiner—Harold Broome
Attorney, Agent, or Firm—Carlo S. Bessone

[57] ABSTRACT

A glow discharge starter having an hermetically sealed, thin-walled envelope of vitreous material, a press seal located at one end thereof and containing an ionizable medium. A pair of non-segmented electrical conductors extend through the press seal and terminate in a spaced relationship to form a pair of electrodes within the envelope. The electrodes are held in the spaced relationship substantially by the press seal. At least one of the electrodes has a bimetallic element secured thereto. The bimetallic element is deformable by heat into engagement with the other electrode. Preferably, the envelope has a wall thickness in the range of from about 0.015 inch to less than about 0.025 inch.

15 Claims, 1 Drawing Figure

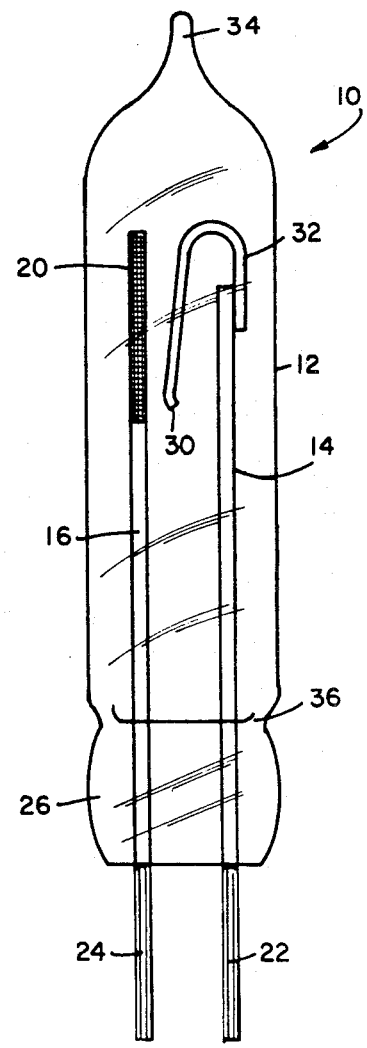

GLOW DISCHARGE STARTER

TECHNICAL FIELD

This invention relates in general to glow discharge starters for arc discharge lamps and more particularly to an improved glow discharge starters having a simplified construction.

BACKGROUND OF THE INVENTION

A glow discharge starter is usually connected across or in parallel with an arc discharge lamp and contains a pair of electrodes. At least one of the electrodes comprises a bimetallic element which, when heated as a result of the glow discharge, bends towards the other electrode. When contact is made, the glow discharge ceases causing the bimetallic element to cool and withdraw from the contacted electrode. When contact is broken, a voltage pulse induced by the induction of the ballast, appears across the opposed electrodes of the lamp thereby initiating an arc discharge within the lamp. If the lamp ignition does not occur after the first voltage pulse, the glow discharge starter sequence is repeated until lamp ignition occurs.

A glow discharge starter of the aforementioned type is described, for example, in the book "Light Sources" by Elenbaas, Philips Technical Library, pages 102-103. Other examples of glow discharge starters are shown in U.S. Pat. Nos. 2,324,907; 2,332,809; 2,376,669; 2,740,861; 2,930,872 and 2,930,873 and German Pat. No. DE3320933A1. Examples of commercially available glow discharge starters are the GB-5A manufactured by GTE Sylvania S.A., Costa Rica, San José and the PL13 manufactured by Osram, a division of Siemans A.G., Munich, W. Germany.

The normal glass used for the glow discharge starter envelope has a wall thickness in the range of about 0.025 inch (0.635 millimeter) to about 0.035 inch (0.887 millimeter). Prior glow discharge starters generally displace a volume greater than 0.75 cubic centimeter. By using the teachings of the present invention, it is possible to reduce the size of the glow discharge starter to about one-third the size of prior starters. It has been found that an excessive amount of heat is required to seal glass with the above mentioned wall thickness range. The excessive heat creates several problems in the manufacture of the glow discharge starter.

First, as a result of this heat, the electrical conductors and bimetallic element associated with the heat sensitive bimetallic element tend to undesirably oxidize. Also, a relatively large sealing capacity is required and an excessive amount of flushing gas must be employed in an effort to reduce the oxide formation on the electrical leads and bimetallic element, when glass having a relatively thick wall thickness is utilized.

Second, the increased heat requires the use or more expensive segmented electrical conductors. Generally, a short section of stiff nickel coated steel is butt welded to a small diameter soft wire having a nickel-iron alloy core sheathed in a copper shell. The steel internal portion of the electrical conductors which form the electrodes, are needed to maintain proper spacing between the free end of the bimetallic element and the other electrode. The heat generated during manufacture when the electrical conductors are sealed into the envelope causes the bimetallic element to put a spreading force on the electrical conductors.

Third, a standard press seal alone cannot be used in these prior glow discharge starters to hold the electrodes in their spaced relationship because the sealing heat would overstress the bimetallic element, causing misalignment of the electrodes. As a result, the prior glow discharge starters use various approaches. One approach involves sealing a glass bead or base on the electrical conductors to act as a heat sink during the subsequent press sealing operation. An alternate approach comprises first sealing the electrical conductors in a flare tube with an exhaust stem to form a mount. The mount is then sealed into the envelope.

SUMMARY OF THE INVENTION

It is, therefore, an object of the invention to obviate the disadvantages of the prior art.

It is another object of the invention to provide an improved glow discharge starter that would constitute an advancement in the art.

It is still another object of the invention to provide a glow discharge starter having reduced component and manufacturing costs.

These objects are accomplished, in one aspect of the invention, by the provision of a glow discharge starter comprising an hermetically sealed, thin-walled envelope of vitreous material having a press seal located at one end thereof and containing an ionizable medium. A pair of non-segmented electrical conductors extend through the press seal and terminate in a spaced relationship to form a pair of electrodes within the envelope. The electrodes are held in the spaced relationship substantially by the press seal. At least one of the electrodes has a bimetallic element secured thereto. The bimetallic element is deformable by heat from the glow discharge into engagement with the other electrode.

In accordance with further aspects of the present invention, the electrical conductors are comprised of a nickel-iron alloy. In a preferred embodiment, the are comprised of a nickel-iron alloy coated with a layer of copper and plated with an electrically conductive material. Preferably, the electrically conductive material is selected from the group consisting of nickel, platinum and rhodium.

In accordance with still further teachings of the invention, the are comprised of "Dumet" wire or nickel-plated "Dumet" wire.

In accordance with the teachings of the present invention, the thin-walled envelope has a wall thickness in the range of from about 0.015 inch (0.380 millimeter) to less than about 0.025 inch (0.635 millimeter). Preferably, the thin-walled envelope has an outside diameter of approximately 0.175 inch (4.445 millimeters). In a preferred embodiment, th glow discharge starter displaces a volume of approximately 0.25 cubic centimeters.

In accordance with additional aspects of the invention, a portion of at least one of the electrical conductors within the envelope is coated with a low work function emissive material. Preferably, the low work function emissive material comprises a lanthanum alloy.

BRIEF DESCRIPTION OF THE DRAWING

The sole FIGURE is a front elevational view of an embodiment of a glow discharge starter according to the invention.

BEST MODE FOR CARRYING OUT THE INVENTION

For a better understanding of the present invention, together with other and further objects, advantages and capabilities thereof, reference is made to the following disclosure and appended claims taken in conjunction with the above-described drawing.

Referring now to the drawing with greater particularity there is shown in the sole FIGURE a glow discharge starter 10 in accordance with one embodiment of the invention. Glow discharge starter 10 is shown comprising an hermetically sealed, thin-walled envelope 12 containing an ionizable medium of, for example, argon, helium and mixtures thereof at a pressure of from about 15 to about 20 millimeters of mercury.

It has been discovered that by using a thin-walled envelope, sealing can be accomplished with very little heat. This allows the use of a standard press seal, minimizes the spreading force on the electrodes, and thus permits the use of less expensive leads.

Preferably, envelope 12 has a wall thickness in the range of from about 0.015 inch (0.380 millimeter) to less than about 0.025 inch (0.635 millimeter). Envelope 12 can be made from, for example, G-10 lead glass, G-12 lead glass or lime glass. The above-mentioned glasses are available from Corning Glass Works, Corning, N.Y. A press seal 26 is located at one end of envelope 12. An exhaust tip 34 is located at the other end of envelope 12.

A pair of non-segmented electrical conductors 22 and 24 extend through press seal 26 and terminate in a spaced relationship to form a pair of electrodes 14 and 16, respectively, within envelope 12. A suitable material for electrical conductors 22 and 24 (and corresponding electrode post 14 and electrode 16) is a nickel-iron alloy, such as Niron 52 available from GTE Precision Materials Group, Warren, Pa. Alternatively, the electrical conductors may consist of a nickel-iron alloy core sheathed in a copper shell. An example of such a material is sold under the trade name "Dumet" and consists of a nickel-iron core having a copper sleeve. The copper sleeve constitutes 21 to 25 percent of the total weight of the material and is usually affixed about the nickel-iron core by swagging, welding, molten dipping, etc. Such wire is especially effective for developing glass-to-metal seals. Generally, heat is applied to the glass and to the "Dumet" in an amount sufficient to form an oxide layer on the "Dumet" which, in turn, serves as a bridge between the metal and the glass and insures the desired glass-to-metal seal.

In another embodiment in accordance with the invention, electrical conductors 22 and 24 comprise a nickel-iron alloy core sheathed in a copper shell plated with an electrically conductive material selected from the group consisting of nickel, platinum and rhodium. Specifically, nickel-plated "Dumet" wire having a diameter in the range of from about 0.010 inch (0.254 millimeter) to about 0.025 inch (0.635 millimeter) is preferred because of the relatively low cost as compared with other metal-plated wires.

Electrode 14 has a bimetallic element 32 secured at one end thereof. Bimetallic element 32 which is bent over into a U-shape, as shown in the sole FIGURE, so that the free end 30 thereof is proximate electrode 16. Bimetallic element 32 consists of two strips of metal having different linear coefficients of expansion welded together. The side of higher coefficient of expansion is on the inside curve of the U so that bimetallic element 32, when heated by the glow discharge, opens and engages electrode 16. The free end 30 of bimetallic element 32 may be provided with an outwardly projecting embossment or curved portion (not shown) to insure that contact with electrode 16 is always made at the same point after flexure of bimetallic element 32 through a predetermined distance.

Alternatively, electrode 16 can be constructed as a second bimetallic electrode (i.e., have a bimetallic element secured thereto) as shown, for example, in previously mentioned U.S. Pat. No. 2,930,873.

A section 20 of electrode 16 adjacent bimetallic element 32 is coated with a low work function emissive material, such as a lanthanum alloy (e.g., lanthanum-nickel), to lower the breakdown voltage of glow discharge starter 10.

In a typical but non-limitative example of a glow discharge starter made in accordance with the invention, the envelope 12 was made from G-12 lead glass having a wall thickness of about 0.016 inch (0.406 millimeter) and an outside diameter of approximately 0.175 inch (4.445 millimeters). A pair of nickel-plated "Dumet" electrical conductors 22, 24 with a diameter of approximately 0.020 inch (0.508 millimeter) extend through a press seal 26 located at one end of the envelope and terminate within the envelope to form a pair of electrode 14, 16. The substantially parallel electrodes are spaced approximately 0.060 inch (1.524 millimeters) from each other. The distance from exhaust tip 34 to the top 36 of stem press 26 was approximately 0.660 inch (16.764 millimeters). A bimetallic element 32 having a width of approximately 0.063 inch (1.6 millimeters), an overall length of approximately 0.320 inch (8.128 millimeters) and a thickness of approximately 0.004 inch (0.102 millimeter) bent over into a U-shape and welded to electrode 39 within envelope 12. A suitable material for bimetallic element 32 is designated as type B1 and is available from Texas Instruments, Attleboro, Mass. A portion of the other electrode 16 was dipped in a molten lanthanum alloy to provide a low work function emissive material 20. The envelope 12 contained an ionizable medium of 25 percent helium–75 percent argon at a pressure of approximately 18 millimeters of mercury. The glow discharge starter 10 displaced a volume of approximately 0.25 cubic centimeters. Samples of the finished glow discharge starters were tested for closure and non-reclosure voltage, spike voltage at 115 volts (60 cycles), closure voltage with two glow discharge starters in worst-case series configuration and 32° F. (0° C.) cold start time using a 13 watt fluorescent lamp. Results are shown below in TABLE I.

TABLE I

| | |
|---|---|
| Closure Voltage | 93.4 volts |
| Non-reclosure Voltage | 86.0 volts |
| Spike Voltage | 970.0 volts |
| Series Closure Voltage | 185.0 volts |
| Cold Start Time | 4.2 seconds |

Thus there has been shown and described an improved glow discharge starter. The starter as defined is more compact in size, contains fewer components and is less expensive to manufacture than prior glow discharge starters.

While there have been shown and described what are at present considered to be the preferred embodiments of the invention, it will be apparent to those skilled in the art that various changes and modifications can be made herein without departing from the scope of the invention as defined by the appended claims.

What is claimed is:

1. A glow discharge starter comprising an hermetically sealed, thin-walled envelope of vitreous material having a wall thickness less than about 0.025 inch and having a press seal located at one end thereof and containing an ionizable medium; a pair of non-segmented electrical conductors extending through said press seal and terminating in a spaced relationship to form a pair of electrodes within said envelope, said electrodes being held in said spaced relationship substantially by said press seal, at least one of said electrodes having a bimetallic element secured thereto, said bimetallic element being deformable by heat from the glow discharge into engagement with the other of said electrodes.

2. The glow discharge starter of claim 1 wherein said electrical conductors are comprised of a nickel-iron alloy.

3. The glow discharge starter of claim 1 wherein said electrical conductors are comprised of a nickel-iron alloy core sheathed in a copper shell.

4. The glow discharge starter of claim 3 wherein said electrical conductors are plated with an electrically conductive material.

5. The glow discharge starter of claim 4 wherein said electrically conductive material is selected from the group consisting of nickel, platinum and rhodium.

6. The glow discharge starter of claim 1 wherein said electrical conductors are comprised of "Dumet" wire.

7. The glow discharge starter of claim 1 wherein said electrical conductors are comprised of nickel-plated "Dumet" wire.

8. The glow discharge starter of claim 1 wherein said thin-walled envelope has a wall thickness in the range of from about 0.015 inch to less than about 0.025 inch.

9. The glow discharge starter of claim 1 wherein said thin-walled envelope has an outside diameter of approximately 0.175 inch.

10. The glow discharge starter of claim 1 wherein said envelope is glass.

11. The glow discharge starter of claim 1 wherein said glow discharge starter displaces a volume of approximately 0.25 cubic centimeters.

12. The glow discharge starter of claim 2 wherein a portion of at least one of said electrode within said envelope is coated with a low work function emissive material.

13. The glow discharge starter of claim 12 wherein said low work function emissive material comprises a lanthanum alloy.

14. The glow discharge starter of claim 1 wherein said ionizable medium comprises argon.

15. The glow discharge starter of claim 1 wherein said ionizable medium comprises a mixture of argon and helium.

* * * * *